United States Patent
Böhm et al.

(10) Patent No.: US 9,374,091 B2
(45) Date of Patent: Jun. 21, 2016

(54) INPUT CIRCUIT ARRANGEMENT, OUTPUT CIRCUIT ARRANGEMENT, AND SYSTEM HAVING AN INPUT CIRCUIT ARRANGEMENT AND AN OUTPUT CIRCUIT ARRANGEMENT

(75) Inventors: Michael Böhm, Graz (AT); Johannes Fellner, Pirka (AT)

(73) Assignee: AMS AG, Unterpremstaetten (AT)

( * ) Notice: Subject to any disclaimer, the term of this patent is extended or adjusted under 35 U.S.C. 154(b) by 47 days.

(21) Appl. No.: 13/997,172

(22) PCT Filed: Dec. 20, 2011

(86) PCT No.: PCT/EP2011/073432
§ 371 (c)(1),
(2), (4) Date: Sep. 9, 2013

(87) PCT Pub. No.: WO2012/084966
PCT Pub. Date: Jun. 28, 2012

(65) Prior Publication Data
US 2013/0342260 A1    Dec. 26, 2013

(30) Foreign Application Priority Data
Dec. 22, 2010  (DE) .......................... 10 2010 055 618

(51) Int. Cl.
| | | |
|---|---|---|
| G06F 3/00 | (2006.01) |
| H03K 19/0175 | (2006.01) |
| G06F 13/42 | (2006.01) |
| G06F 13/38 | (2006.01) |
| G06F 3/16 | (2006.01) |
| G06F 1/32 | (2006.01) |

(52) U.S. Cl.
CPC .... H03K 19/017509 (2013.01); G06F 13/4295 (2013.01); *G06F 1/3203* (2013.01); *G06F 3/16* (2013.01); *G06F 13/385* (2013.01)

(58) Field of Classification Search
None
See application file for complete search history.

(56) References Cited

U.S. PATENT DOCUMENTS

| | | |
|---|---|---|
| 5,473,758 A | 12/1995 | Allen et al. |
| 5,881,121 A | 3/1999 | Mann |
| 6,008,700 A * | 12/1999 | Pietrzyk .......................... 331/45 |
| 6,088,422 A | 7/2000 | Mann |
| 7,089,467 B2 | 8/2006 | Burch |
| 7,315,585 B2 | 1/2008 | Gater |
| 2002/0106037 A1 | 8/2002 | Gara |
| 2003/0200359 A1 * | 10/2003 | Fernald .............................. 710/5 |
| 2003/0219004 A1 | 11/2003 | Liu et al. |
| 2003/0227279 A1 * | 12/2003 | Feldtkeller .................... 323/222 |
| 2004/0006718 A1 * | 1/2004 | Plappert et al. ............... 713/300 |

(Continued)

FOREIGN PATENT DOCUMENTS

| | | |
|---|---|---|
| DE | 102006042115 A1 | 3/2008 |
| WO | WO-2008028853 A1 | 3/2008 |

*Primary Examiner* — Henry Tsai
*Assistant Examiner* — Aurangzeb Hassan
(74) *Attorney, Agent, or Firm* — McDermott Will & Emery LLP

(57) ABSTRACT

The invention relates to an input circuit arrangement (11), which is designed for operation either in a first or a second operating mode (A, B) and comprises a connection (13) for supplying a connection signal (SWI) and a detection circuit (14). The detection circuit (14) is coupled on the input side to the connection (13) and is designed to put the input circuit arrangement (11) into an operating mode from a group comprising the first and second operating modes (A, B) depending on the steepness of a change of the connection signal (SWI).

6 Claims, 5 Drawing Sheets

(56) References Cited

U.S. PATENT DOCUMENTS

Figure 1A:
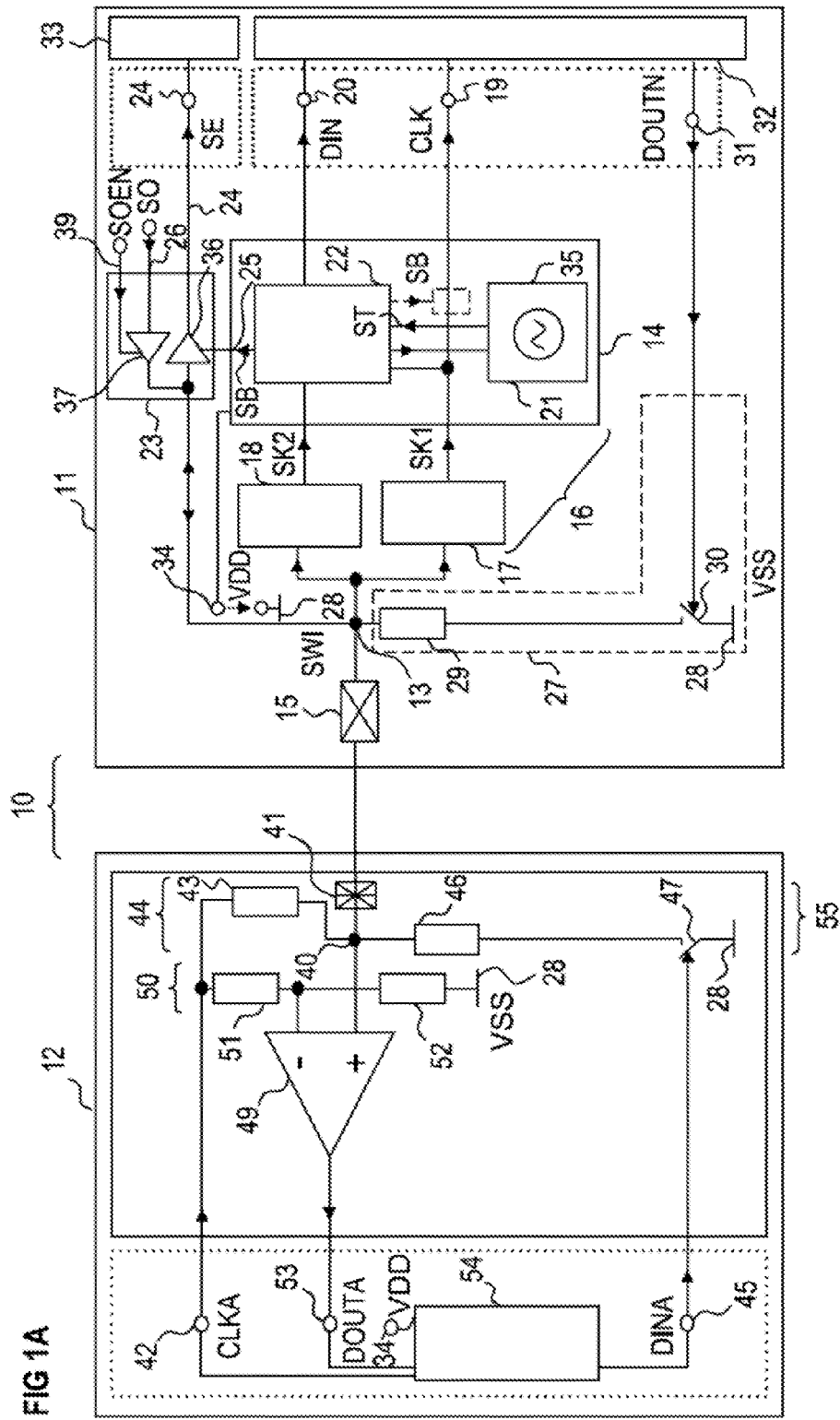

| | | |
|---|---|---|
| 2004/0039963 A1* | 2/2004 | Burch ............................ 714/25 |
| 2006/0031736 A1* | 2/2006 | Fahlenkamp et al. ......... 714/755 |
| 2006/0087307 A1 | 4/2006 | De Winter |
| 2006/0176040 A1* | 8/2006 | Kernahan et al. ............. 323/299 |
| 2008/0080652 A1 | 4/2008 | Wang et al. |
| 2009/0252068 A1 | 10/2009 | Charles et al. |
| 2010/0301907 A1* | 12/2010 | Voorwinden et al. ......... 327/117 |
| 2011/0221619 A1* | 9/2011 | Asayama et al. ............. 341/144 |
| 2013/0033248 A1* | 2/2013 | Granger ........................ 323/288 |
| 2013/0111189 A1* | 5/2013 | Boehl et al. .................... 712/29 |
| 2013/0159559 A1* | 6/2013 | Hess ............................... 710/14 |

* cited by examiner

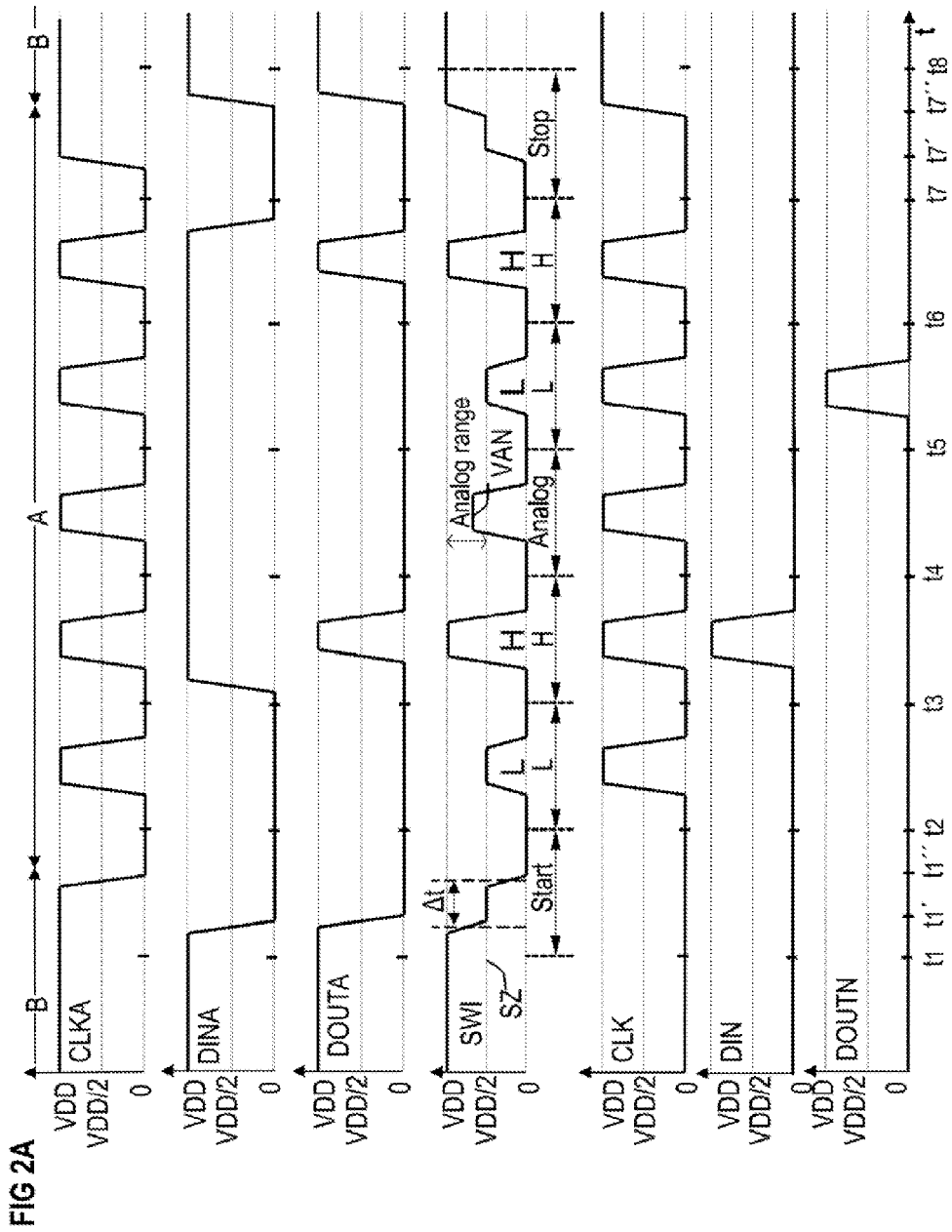

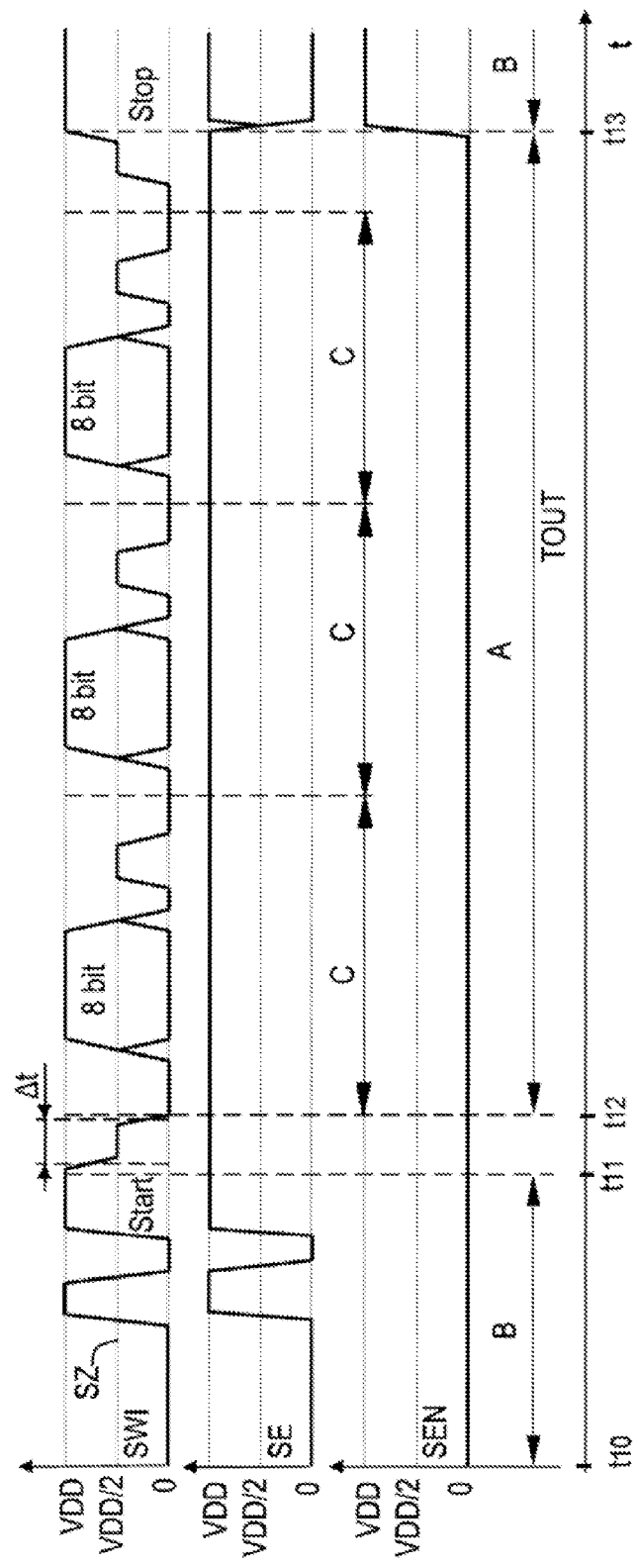

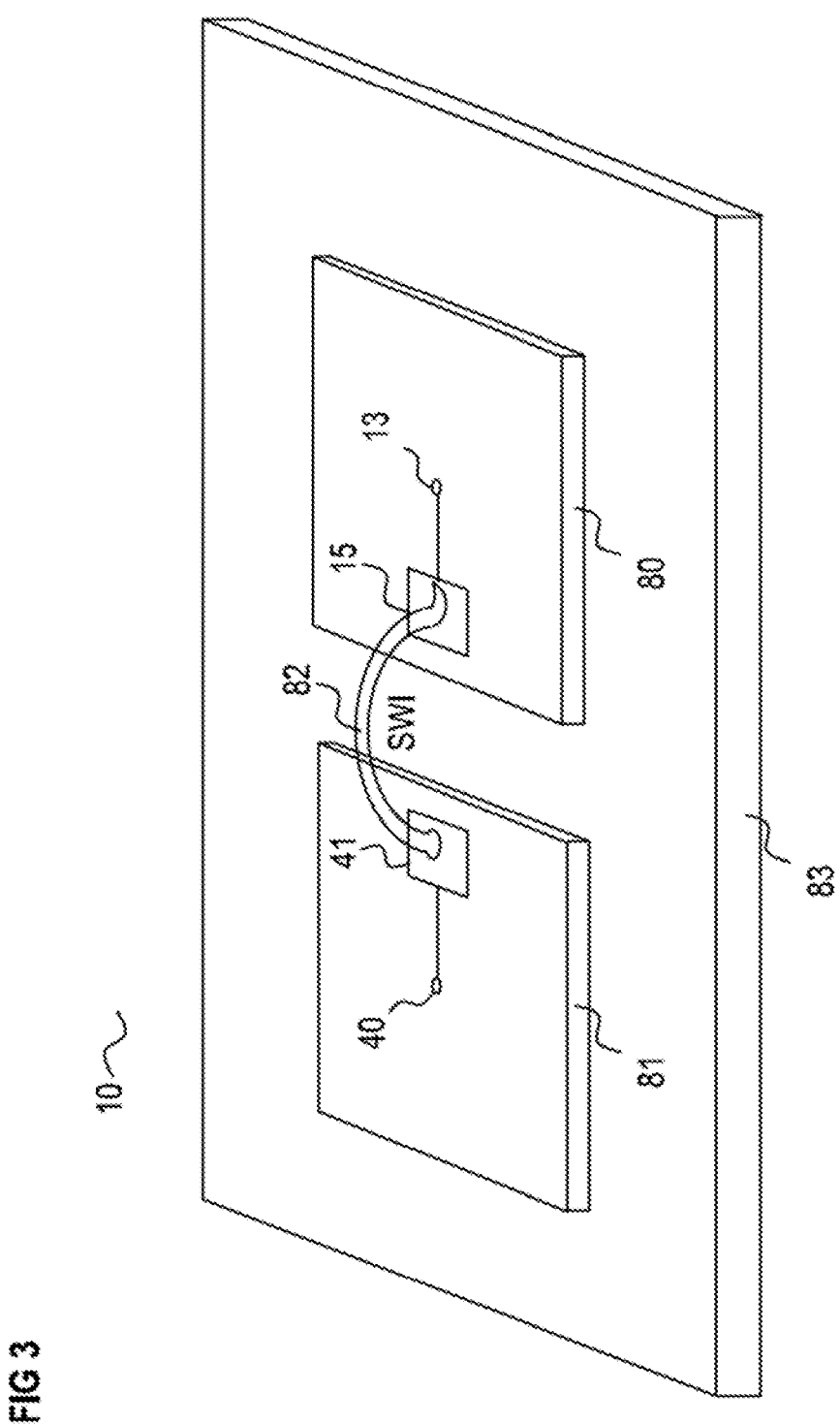

INPUT CIRCUIT ARRANGEMENT, OUTPUT CIRCUIT ARRANGEMENT, AND SYSTEM HAVING AN INPUT CIRCUIT ARRANGEMENT AND AN OUTPUT CIRCUIT ARRANGEMENT

Input circuit arrangement output circuit arrangement, and system having an input circuit arrangement and an output circuit arrangement The present invention relates to an input circuit arrangement, to an output circuit arrangement as well as to a system having an input circuit arrangement and an output circuit arrangement.

For a data exchange between an input circuit arrangement and an output circuit arrangement, a clock input, a data input, and a data output in the input circuit arrangement are frequently provided. For this purpose, several connection surfaces are arranged on a semiconductor body that comprises the input circuit arrangement. The data input and the data output can also use a common connection surface, such as an inter-integrated circuit bus, abbreviated I2C bus, for example.

Document DE 10 2006 042 115 A1 relates to a circuit arrangement that comprises a control circuit and a memory chain. The circuit arrangement comprises a first input for supplying an operating mode signal, a second input for supplying a clock signal, and a bidirectional contact for providing data signals.

The documents U.S. Pat. No. 5,881,121, U.S. Pat. No. 7,089,467 B2 and US 2006/0087307 A1 describe an interface having a connection, wherein a signal can assume three different level values.

The aim of the present invention is to provide an input circuit arrangement, an output circuit arrangement as well as a system having an input and an output circuit arrangement, which have a high versatility and flexibility in the use of such a connection.

The aim is achieved with the subjects of the independent claims. Variants and embodiments are the respective subjects of the dependent claims.

In an embodiment, an input circuit arrangement comprises a connection and a detection circuit which is connected, on the input side, to the connection.

The input circuit arrangement is designed for operation either in a first or in a second operating mode. The connection is used for tapping a connection signal. The detection circuit is designed to put the input circuit arrangement into an operating mode from a group comprising the first and the second operating mode depending on a steepness of a change of the connection signal.

Advantageously, the detection of the steepness of the change of the connection signal is sufficient to put the input circuit arrangement alternatingly into the first and into the second operating mode. Thus, the action of shifting into the first or the second operating mode does not occur as a result of two predetermined constant values of the connection signal. Using the values of the connection signal, it is thus possible to supply additional information to the input circuit arrangement, independently of the setting of the operating mode. Thus, the connection has versatile and flexible uses.

In an embodiment, in the first operating mode, data information as well as clock information is applied to the input circuit arrangement via the connection. The input circuit arrangement is designed to provide, in the second operating mode, an input signal that corresponds to the connection signal.

In an embodiment, the input signal follows the connection signal in the second operating mode. The input signal is constant during the first operating mode, and it does not follow the connection signal. For example, during the first operating mode, the input signal can retain the last value prior to the determination of the first operating mode. Alternatively, during the first operating mode, for example, the input signal can constantly have a predetermined logic value.

In an embodiment, the detection circuit provides a clock signal and a data signal depending on the values of the connection signal that are applied during the first operating mode to a clock output and to a data connection. The clock signal and the data signal contain the data information and clock information supplied via the connection. On the other hand, the input circuit arrangement provides the input signal, depending on the values of the connection signal that are applied during the second operating mode, to a buffer output. The buffer output is separated from the clock output and from the data connection.

In an embodiment, the detection circuit is designed to put the input circuit arrangement into the first operating mode if the steepness of the change of the connection signal is smaller than a predetermined value. Moreover, the detection circuit is designed to put the input circuit arrangement into the second operating mode if the steepness of the change of the connection signal is greater than the predetermined value. Depending on the speed of the change of the connection signal, the input circuit arrangement is thus put into the first or into the second operating mode.

In an embodiment, the detection circuit is designed to put the input circuit arrangement into an operating mode from the group comprising the first and the second operating modes, depending on the steepness of the rising edge of the connection signal.

In a preferred embodiment, the detection circuit is designed to put the input circuit arrangement into an operating mode from the group comprising the first and the second operating modes depending on the steepness of the falling edge of the connection signal. Advantageously, a separate connection for selecting the operating mode is thus avoided. The steepness of the rising edge does not influence the selection of the operating mode.

In an embodiment, the first operating mode is maintained at least for a predetermined maximum duration. The detection circuit for this purpose comprises a clock and a detection logic that is coupled to the connection and to the clock. The clock is designed as an oscillator. The clock is used for the delivery of a pulse signal. The detection logic can be designed to trigger the clock in the case of the detection of the first operating mode. The detection logic counts the pulses of the pulse signal and it determines the time when the maximum duration has elapsed. Here, within the maximum duration, the first operating mode is retained. Advantageously, during the maximum duration, the first operating mode is also retained if the steepness of the change of the connection signal is greater than the predetermined value. Thus, small pulses in the connection signal are also transferable in the first operating mode. During the predetermined maximum duration, there is thus no change from the first into the second operating mode.

In a variant, the detection circuit is designed to put the input circuit arrangement from the first operating mode into the second operating mode, even if the maximum duration has not yet elapsed, if the connection signal comprises a signal sequence that deviates from a number of predetermined signal sequences. In the case of an incorrect signal sequence, it is advantageous to switch over from the first to the second operating mode. In this manner, one prevents the interpretation of the interfering portions or the noise in the connection signal as data. An accidental shifting of the input circuit arrangement into the first operating mode thus has no consequences.

In a variant, the detection circuit is designed for the detection, in the first operating mode, of a first predetermined signal sequence, by means of which the input circuit arrangement is switched permanently into the first operating mode.

In a variant, the detection circuit is designed for the detection, in the first operating mode, of a second predetermined signal sequence, by means of which the input circuit arrangement is switched from the first into the second operating mode.

In a variant, the detection circuit is designed for the detection, in the first operating mode, of a third predetermined signal sequence, by means of which the maximum duration is invalidated. Thus, even after the expiration of the maximum duration, there is no change from the first into the second operating mode.

In an embodiment, an input circuit arrangement comprises a connection as well as an evaluation circuit. The connection is used for supplying a connection signal. The evaluation circuit is connected on the input side to the connection. The evaluation circuit is implemented for the purpose of converting the connection signal into a data signal and a clock signal. Here, the connection signal comprises clock pulses, which originate from a reference value, as well as a first level in the case of a first logic value of the data signal, and an intermediate level in the case of a second logic value of the data signal. The intermediate level lies between the first level and the reference value.

Advantageously, the connection signal is composed in a simple manner from the data signal and the clock signal. Thus, via a connection, clock information and data information are provided to the input circuit arrangement, and the connection is used in a versatile manner.

The first level can have the value of a supply voltage, and the reference value can have the value of a reference potential. Alternatively, the first level can have the value of the reference potential, and the reference value can have the value of the supply voltage. The intermediate level can be a value between the value of the supply voltage and the value of the reference potential.

In an embodiment, the connection signal, the data signal, and the clock signal approximately satisfy the following equation:

$$swi = KA \cdot clk \cdot (1 + KB \cdot din)$$

in which swi is the voltage value of the connection signal, din the logic value of the data signal, clk the logic value of the clock signal, and KA and KB are constants. The term approximately can express, for example, that, owing to the processing of the connection signal in the evaluation circuit, pulses of the clock signal and the data signal can comprise a time delay with respect to pulses in the connection signal.

In an embodiment, the input circuit arrangement comprises a first and a second comparing system. The evaluation circuit can comprise the first and the second comparing systems. In addition to the first and second comparing systems, the evaluation circuit can comprise the detection circuit. The first and the second comparing systems, on the input side, are connected to the connection and, on the output side, to the detection circuit. The first comparing system compares the connection signal or a signal derived from the connection signal to a first predetermined threshold value and, depending on the result of the comparison, it provides a first comparative signal to the detection circuit. Moreover, the second comparing system compares the connection signal or the signal derived from the connection signal to a second predetermined threshold value. The first predetermined threshold value differs from the second predetermined threshold value. Depending on the result of the comparison, the second comparing system provides a second comparative signal to the detection circuit. The first and the second comparing systems are used to split the connection signal into a clock signal and a data signal. The comparing systems can be designed as comparators.

In an embodiment, the detection circuit is designed to evaluate, in the first operating mode, the first and the second comparative signals. Here, the detection circuit provides a clock signal depending on the first and the second comparative signals. Moreover, the detection circuit provides a data signal depending on the first and the second comparative signals.

In a variant, the detection circuit generates the clock signal exclusively depending on the first comparative signal. The second comparative signal is not used for the generation of a clock signal.

In a variant, the detection circuit generates the data signal exclusively depending on the second comparative signal. The first comparative signal is not used here for the generation of the data signal. Thus, the clock signal and the data signal are generated highly efficiently. The first and the second comparing systems allow an effective conversion of the connection signal, which can comprise three signal levels, into the data signal and the clock signal.

In an embodiment, the input circuit arrangement is designed to influence the connection signal depending on a data output signal. Thus, the input circuit arrangement can output data to the connection. The input circuit arrangement can thus be not only the recipient of data, but also the sender of data. For this purpose, the input circuit arrangement can comprise a signal converter, which is connected to the connection. Thus, the connection can be used in a versatile manner.

In an embodiment, the input circuit arrangement thus embodies the principle of a single-wire serial interface with activation.

In an embodiment, in the first operating mode, via the connection, both data information and also clock information are supplied to the input circuit arrangement. The second operating time can be provided for supplying an activation signal via the connection to the input circuit arrangement.

In a variant, the input circuit arrangement has a third operating mode, in which the input circuit arrangement is in a test mode. The input circuit arrangement changes from the first into the third operating mode because the detection circuit is designed to detect, in the first operating mode, a fourth predetermined signal sequence.

In an embodiment, the detection circuit is designed to put the input circuit arrangement into the first operating mode if the falling edge of the connection signal comprises the step with a value of the intermediate level. Moreover, the detection circuit can be designed to put the input circuit arrangement into the second operating mode if the falling edge of the connection signal does not have a step that is on the value of the intermediate level. The falling edge can be the transition of the connection signal from a supply voltage to a reference potential.

In an embodiment, an output circuit arrangement comprises an output connection, a clock connection, a data input as well as an arrangement for generating an intermediate level. The output connection is suitable for outputting a connection signal. The clock connection is designed to supply a clock connection signal. The arrangement for generating an intermediate level, on the input side, is connected to the clock connection and the data input, and, on the output side, to the output connection. The arrangement for generating an intermediate level is designed to convert the data input signal and the clock connection signal into the connection signal in such a manner that the connection signal comprises clock pulses that originate from a reference value and that have a first level in the case of a first logic value of the data input signal and an intermediate level in the case of a second logic value of the data input signal. The intermediate level has a value between the first level and the reference value.

Advantageously, the output circuit arrangement can generate the output signal from the clock connection signal and the data input signal.

In an embodiment, the arrangement comprises a voltage splitter for generating an intermediate level. A voltage splitter tap is connected to the output connection. A first external connection of the voltage splitter is connected to the clock connection. A second external connection of the voltage splitter is connected, in the case of a first logic value of the data input signal, to a reference potential connection. In the case of a second logic value of the data input signal, the second external connection of the voltage splitter is switched open or it is connected to a supply voltage connection. The voltage splitter allows a cost-effective and flexible generation of the three signal levels of the connection signal.

In an embodiment, by means of the clock connection signal, the output connection is set to the value of the supply voltage. Subsequently, the data input signal controls the arrangement for generating an intermediate level in such a manner that the voltage of the connection signal is reduced. Subsequently, the clock signal sets the output connection to the value of the reference potential. The decrease of the connection signal thus occurs with one step. Due to the selection of the clock connection signal and the data input signal, the steepness of a change of the connection signal can consequently be set. The output circuit arrangement as a result puts the input circuit arrangement either into the first or into the second operating mode.

In an embodiment, a system comprises the input circuit arrangement as well as the output circuit arrangement. Here, the output connection of the output circuit arrangement is coupled to the connection of the input circuit arrangement. The connection signal of the output connection of the output circuit arrangement is approximately identical to the connection signal at the connection of the input circuit arrangement.

Advantageously, it is possible to have both the supply of data as well as the supply of a clock pulse from the output circuit arrangement to the input circuit arrangement via a single connection surface of the output circuit arrangement, which is connected to the output connection, as well as via a single connection surface of the input circuit arrangement, which is connected to the connection. As a result of the small number of connections between the output and the input circuit arrangements, a surface on a support is kept low. Moreover, such a system can be produced cost-effectively.

The system makes it possible to link the clock information and the data information, and separate them again after the transfer.

In an embodiment, the system is implemented, and the input circuit arrangement is put into the first operating mode. The input circuit arrangement is here connected detachably to the output circuit arrangement. Thus, for example, the input circuit arrangement can be programmed or calibrated by the manufacturer. Subsequently, the input circuit arrangement is inserted into an application system. The connection of the input circuit arrangement to the application system can be permanent and not detachable. The input circuit arrangement, after the insertion into the application system, is put into the second operating mode.

In a further embodiment, the output circuit arrangement can be constructed with separate components, and thus implemented in a simple manner for the laboratory operation.

In a further embodiment, the output circuit arrangement can be implemented by a signal generator, as is available for professional testing systems.

The invention is described in further detail below in several embodiment examples with reference to the figures. Components and circuit elements that have identical functions or effects bear identical reference numerals. To the extent that circuit portions or component elements have corresponding functions, their description is not repeated in each one of the following figures.

Figure 1B:
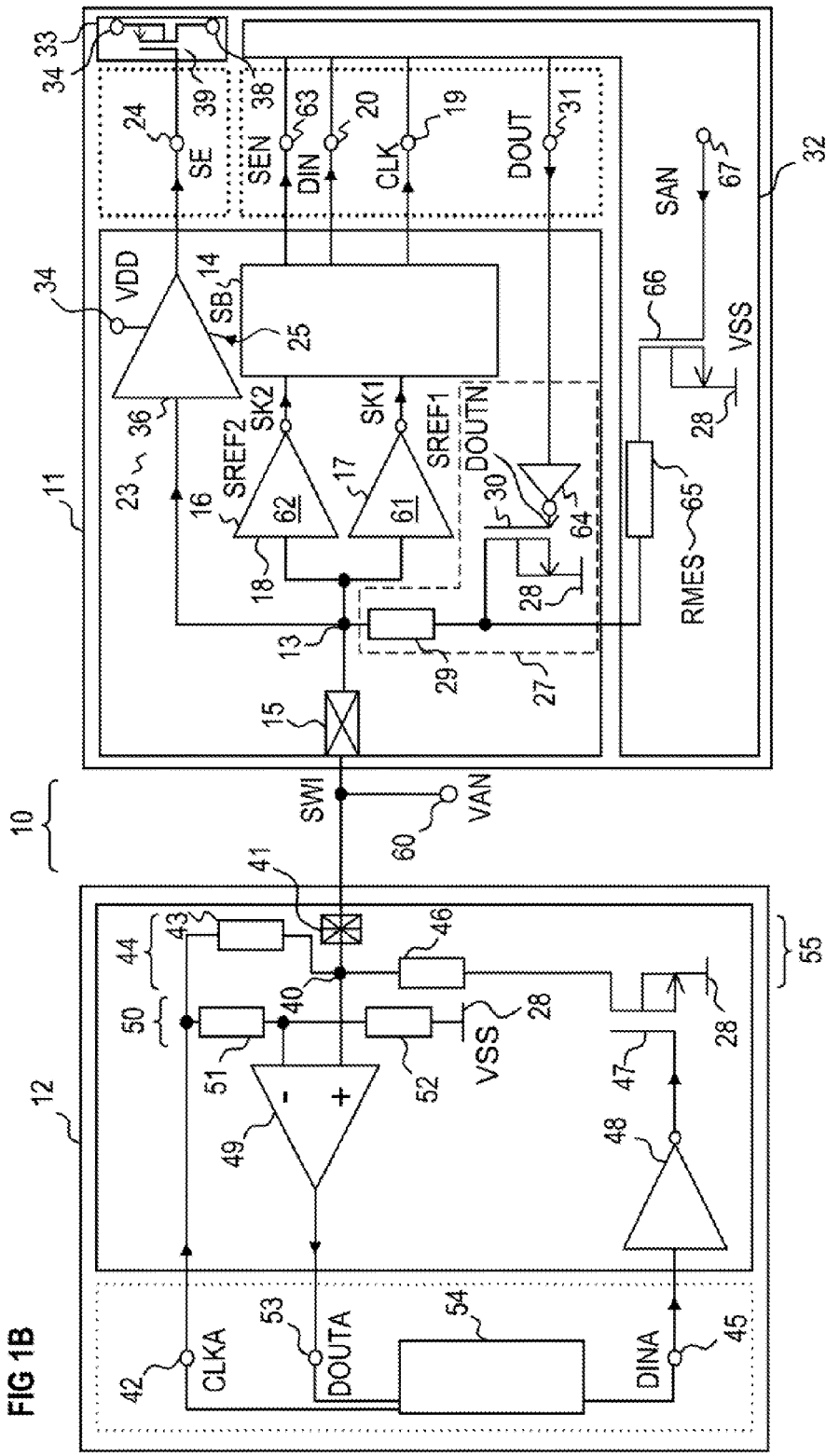

FIGS. 1A and 1B show examples of embodiments of a system according to the proposed principle, FIGS. 2A and 2B show examples of signal curves of a system according to the proposed principle, and FIG. 3 shows an example of an embodiment of a system in a spatial representation according to the proposed principle.

FIG. 1A shows an example of an embodiment of a system 10 according to the proposed principle. The system 10 comprises an input circuit arrangement 11 and an output circuit arrangement 12. The input circuit arrangement 11 comprises a connection 13 and an evaluation circuit 16, which is connected on the input side to the connection 13. The input circuit arrangement 11 comprises a connection surface 15, to which the connection 13 is connected. The evaluation circuit 16 comprises a detection circuit 14. The detection circuit 14 is coupled to the connection 13.

The evaluation circuit 16 comprises a first and a second comparing system 17, 18, which are both connected on the input side to the connection 13. An output of the first comparing system 17 and an output of the second comparing system 18 are connected to the detection circuit 14. The detection circuit 14 comprises a clock output 19 and a data connection 20. The detection circuit 14 couples the clock output 19 to the output of the first comparing system 17 and to the output of the second comparing system 18. Furthermore, the detection circuit 14 couples the data connection 20 to the output of the first comparing system 17 and to the output of the second comparing system 18. For this purpose, the detection circuit 14 connects the clock output 19 to the output of the first comparing system 17. The clock output 19 is connected directly and permanently to the output of the first comparing system 17.

Moreover, the detection circuit 14 comprises a clock 21 as well as a detection logic 22. An output of the detection logic 22 is connected to an input of the clock 21, and an input of the detection logic 22 is connected to an output of the clock 21. Additional inputs of the detection logic 22 are connected to the output of the first comparing system 17 and to the output of the second comparing system 18. The data connection 20 is connected to an output of the detection logic 22. The detection logic 22 is implemented as a digital circuit and it comprises a logic gate. The detection logic 22 comprises a counter. The counter can comprise a chain of flip-flops.

In addition, the input circuit arrangement 11 comprises a signal buffer memory 23 that is connected to the connection 13. The signal buffer memory 23 comprises a buffer output 24. The detection circuit 14 comprises an operating mode output 25, which is connected to a control input of the signal buffer memory 23. The operating mode output 25 is connected to the detection logic 22. The signal buffer memory 23 is implemented as a memory. The signal buffer memory 23 comprises a buffer 36 that is connected on the input side to the connection 13 and on the output side to the buffer output 24. The buffer 36 has a signal stop function. A control input of the buffer 36 is coupled to the operating mode output 25. Moreover, the signal buffer memory 23 comprises an additional buffer 37 with an input that is connected to an output connection 26. A control input of the additional buffer 36 is connected to an output active circuit 39. The additional buffer 37 comprises a tristate output. On the output side, the additional buffer 37 is connected to the connection 13. The signal buffer memory 23 thus comprises the buffer 36 and the additional buffer 37, which are connected antiparallel.

Moreover, the input circuit arrangement 11 comprises a signal converter 27 that is connected on the output side to the connection 13. The signal converter 27 couples the connection 13 to a reference potential connection 28. The signal converter 27 comprises a resistive element 29 that is arranged in the current path between the connection 13 and the reference potential connection 28. The resistive element 29 is implemented as a resistor. Moreover, the signal converter 27 comprises a switch 30 that is series-connected to the resistive element 29. The series circuit comprising the switch 30 and the resistive element 29 connects the connection 13 to the reference potential connection 28. Here, the resistive element 29 is connected to the connection 13, and the switch 30 to the reference potential connection 28. The resistive element 29 can have a resistance value in a range between 1 Ohm and 10 MOhm. It is preferable that the resistive element 29 has a resistance value in a range between 100 Ohm and 1 MOhm. Moreover, it is preferable that the resistive element 29 has a resistance value in a range between 1 kOhm and 100 kOhm. The resistance value of the resistive element 29 is 10 kOhm, for example.

In addition, the input circuit arrangement 11 comprises a data output 31 that is connected to a control connection of the signal converter 27. For this purpose, the data output 31 is connected to the control connection of the switch 30. Moreover, the input circuit arrangement 11 comprises a circuit block 32. The circuit block 32 is connected to the clock output 19, to the data connection 20, and to the data output 31. The circuit block 32 can be a digital circuit with a serial interface. The input circuit arrangement 11 comprises an additional circuit block 33 that is connected to the buffer output 24.

The output circuit arrangement 12 comprises an output connection 40. The output connection 40 is coupled to the connection 13. The output connection 40 is connected to an additional connection surface 41 of the output circuit arrangement 12. The additional connection surface 41 is coupled to the connection surface 15 of the input circuit arrangement 11. The output connection 40 is connected directly and permanently to the connection 13. The output circuit arrangement 12 comprises an arrangement for the generation of an intermediate level 55. The arrangement for the generation of an intermediate level 55 comprises a voltage splitter 44 with a first and a second voltage splitter resistor 43, 46. The first and the second voltage splitter resistors 43, 46 each have a resistance value that corresponds approximately to the resistance value of the resistive element 29.

The output circuit arrangement 12 in addition comprises a clock connection 42 and a data input 45, which are coupled to the arrangement 55 for the generation of an intermediate level SZ. The clock connection 42 is connected via the first voltage splitter resistor 43 to the output connection 40. The output connection 40 is connected via the second voltage splitter resistor 46 and an output switch 47 to the reference potential connection 28. The control connection of the output switch 47 is coupled to the data input 45.

Here, the second voltage splitter resistor 46 is connected to the output connection 41, and the output switch 47 is connected to the reference potential connection 28.

Furthermore, the output circuit arrangement 12 comprises a comparator 49 that is connected at a first input to the output connection 40. The comparator 49 is provided for the digital readout. Its reference level is set, for example, between VDD and VDD/2 via a reference voltage splitter 50. The reference level of the comparator 49 is higher than the intermediate level SZ. The reference voltage splitter 50 connects the clock connection 42 to the reference potential connection 28. Alternatively, the reference voltage splitter 50 connects the supply voltage connection 34 to the reference potential connection 28. The reference voltage splitter 50 comprises a first and a second comparative resistor 51, 52. A node between the first and the second comparative resistors 51, 52 is connected to a second input of the comparator 49. The first comparative resistor 51 connects the second input of the comparator 49 to the clock input 42. The second comparative resistor 52 connects the second input of the comparator 49 to the reference potential connection 28.

The resistance value of the second comparative resistor 52 is greater than the resistance value of the first comparative resistor 51. In an example, the resistance value of the second comparative resistor 52 is twice the resistance value of the first comparative resistor 51. The resistance value of the comparative resistor 51 in an embodiment is 10 kOhm, and the resistance value of the second comparative resistor 52 is 20 kOhm. A data output 53 is connected to the output of the comparator 40. In addition, the output circuit arrangement 12 comprises an interface control block 54, which is connected to the clock connection 42, to the data input 45, and to the data output 53. The interface control block 54 comprises a signal generator. The interface control block 54 can be implemented as a microcontroller. The interface control block 54 can also be implemented as a personal computer, which is coupled via a digital interface to the additional portions of the output circuit arrangement 12.

At the connection 13, the connection signal SWI is tappable. The connection signal SWI is supplied to the first and the second comparing system 17, 18. The first and the second comparing systems 17, 18 generate a first and a second comparative signal SK1, SK2 depending on the connection signal SWI and on the first threshold value SREF1 of the first comparing system 17 and on the second threshold value SREF2 of the second comparing system 18. Here, the first threshold value SREF1 is smaller than the second threshold value SREF2. At a supply voltage connection 34 of the input circuit arrangement 11, a supply voltage VDD is tappable. At the reference potential connection 28, a reference potential VSS is tappable. The intermediate level SZ divides the range between the supply voltage VDD and the reference potential VSS into two ranges, so that the following holds:

$$VSS < SREF1 < SZ < SREF2 < VDD$$

in which SZ is the value of the intermediate level, SREF1 is the value of the first threshold value, SREF2 is the value of the second threshold value, VDD is the value of the supply voltage, and VSS is the value of the reference potential. It is preferable that the intermediate level SZ has the value of half of the supply voltage VDD, so that SZ=VDD/2. The first and the second comparing systems 17, 18 can be implemented as comparators or buffers with adjustable switching thresholds. The first threshold value SREF1 of the first comparing system 17 is preferably between the reference potential VSS and VDD/2, and the second threshold value SREF2 of the second comparing system 18 is preferably between VDD/2 and supply voltage VDD.

A clock signal CLK is tappable at the clock output 19. A data signal DIN is tappable at the data connection 20. The clock signal CLK can be identical to the first comparative signal SK1. In an embodiment, the data signal DIN can be identical to the second comparative signal SK2. The detection logic 22 is implemented in such a manner that the data provided by the data signal DIN are transferred to the falling edge of the clock signal CLK. The data signal DIN is formed therefore in such a manner in the detection logic 22 that the rising edges of the data signal DIN and of the clock signal CLK fall one on top of the other, and the falling edges of the data signal DIN and of the clock signal CLK coincide.

The clock 21 outputs a pulse signal ST. The frequency of the pulse signal ST can be higher than the frequency of the clock signal CLK. The clock 21 is activated in the first operating mode A and deactivated in the second operating mode B. Moreover, the detection circuit 14 is implemented in such a manner that it determines, from the values of the first and the second comparative signals SK1, SK2, whether the input circuit arrangement 11 has to be put into the first or into the second operating mode A, B. For this purpose, the detection logic 22 evaluates the first and the second comparative signals SK1, SK2 in such a manner that, in the case of a high steepness of a change of the connection signal SWI, the second operating mode B is set, and in the case of a low steepness of the change of the connection signal SWI, the first operating mode A is set. The detection logic 22 is designed to determine the operating mode depending on the falling edge of the connection signal SWI. For this purpose, the detection logic 22 investigates, in the case of a falling edge of the connection signal SWI, whether the temporal difference between the edge in the first comparative signal SK1 and the edge in the second comparative signal is smaller than a predetermined value, so that the second operating mode B has to be set, or whether the temporal difference is greater than the predetermined value, so that the first operating mode A has to be set. The detection logic 22 determines the temporal difference by counting the pulses of the pulse signal ST between the falling edge of the second comparative signal SK2 and the falling edge of the first comparative signal SK1.

The detection logic 22 provides, at the operating mode output 25, an operating mode signal SB, which has a first value in the case of the first operating mode A, and a second value in the case of the second operating mode B. If the first operating mode A is detected, then the first comparative signal SK1 is passed through by the detection circuit 14, and it forms the clock signal CLK, and the second comparative signal SK2 is also passed through by the detection circuit 14, and it forms the data signal DIN. If the second operating mode B has been detected, then the clock signal CLK is generated, and it corresponds to the first comparative signal SK1. The data signal DIN, on the other hand, has a constant value in an embodiment.

The operating mode signal SB is supplied to the signal buffer memory 23. The signal buffer memory 23 outputs, at the buffer output 24, an input signal SE. The signal buffer memory 23 stores the last value of the input signal SE in the case of a change to another operating mode. The buffer 36 generates the input signal SE depending on the connection signal SWI and on the operating mode signal SB. The signal buffer memory 23 is implemented in such a manner that it provides, in the second operating mode B, the connection signal SWI as input signal SE. The input signal SE follows the output signal SWI in the second operating mode B. However, if the first operating mode A is detected by the detection circuit 14, then the input signal SE retains the last value before the detection of the first operating mode A. For the duration of the first operating mode A, however, the input signal SE is constant and it has, for example, the logic value 1, and it does not follow the connection signal SWI. The input signal SE can thus be implemented as an enable signal. The input signal SE is an output signal of the signal buffer memory 23. The normal function of the connection 13 and the connection surface 15 is represented by the signal buffer memory 23. The input signal SE is fixed to a defined level, as soon as a valid activation sequence activates the connection 13 for the interface function, which means that the input circuit arrangement 11 is put into the first operating mode A. The signal buffer memory 23 is implemented bidirectionally. A circuit output signal SO applied to the output connection 26 is then supplied to the input of the additional buffer 37. An output active circuit signal SOEN is applied at the control input of the additional buffer 37. The additional buffer 37, at its output, provides a connection signal SWI depending on the circuit output signal SO and on the output active circuit signal SOEN. Thus, the signal buffer memory 23 can be used for the signal transfer from the additional circuit block 33 to the connection 13.

At the data output 31, an inverted output signal DOUTN is applied. The inverted output signal DOUTN is supplied to the signal converter 27. In accordance with the inverted output signal DOUTN, the switch 30 is put into an open or a closed operating state. As a result, the connection signal SWI is influenced, and thus information is output at the connection 13. For example, if the inverted output signal DOUTN switches the switch 30 into an open operating state, then the connection signal SWI takes on a voltage value predetermined by the output circuit arrangement 12. On the other hand, if the inverted output signal DOUTN switches the switch 30 into a conductive operating state, then the connection 13 is connected via the resistive element 29 to the reference potential connection 28, and the connection signal SWI is reduced to the value of the intermediate level SZ or it retains the value of the reference potential VSS.

A clock connection signal CLKA is applied to the clock connection 42. Moreover, at the data output 53, a data output signal DOUTA is applied. Accordingly, a data input signal DINA is supplied to the data input 45. The clock connection signal CLKA is supplied via the first voltage splitter resistor 43 to the output connection 40. The output switch 47 is controlled by the data input signal DINA and it transfers a digital HIGH or LOW to the output connection 41. By means of the data input signal DINA, a setting is carried out so that either the output connection 40 is conductively connected via the second voltage splitter resistor 46 to the reference potential connection 28 or the connection signal SWI is not reduced by a current flow through the second voltage splitter resistor 46. For example, if the data input signal DINA has the logic value 1, then the output switch 47 is in an open operating state, and the connection signal SWI is determined primarily by the clock connection signal CLKA. The clock connection signal CLKA can take on values between the supply voltage VDD and the reference potential VSS. Thus, in the case of a logic value 1 of the clock connection signal CLK, the connection signal SWI takes on the value of the supply voltage VDD, and in the case of the logic value 0 of the clock connection signal CLKA, it takes on the reference potential VSS.

If the data input signal DINA takes on the logic value 0, then the output switch 47 is switched open. A logic value 0 in the clock connection signal CLK thus leads to a connection signal SWI, which has the value of the reference potential VSS. In the case of a logic value 1 of the clock connection signal CLKA, on the other hand, the connection signal SWI takes on the intermediate level SZ as voltage value, which depends on the resistance values of the first and the second voltage splitter resistors 43, 46. The value of the intermediate level SZ can thus be calculated according to the following equation:

$$SZ = \frac{R1B}{R1B + R1A} \cdot VDD$$

in which VDD is the value of the supply voltage, R1A is the resistance value of the first voltage splitter resistor 43, and R1B is the sum of the resistance values of the second voltage splitter resistor 46 and the switch-on resistor of the output switch 47. Here, 0 V is assumed as the value of the reference potential VSS.

Advantageously, the connection signal SWI takes on the value of the reference potential VSS as soon as the clock connection signal CLKA has the logic value 0. In the case of a logic value 0 of the clock connection signal CLKA, the value of the connection signal SWI is not influenced by the value of the data input signal DINA. On the other hand, if the clock connection signal CLKA has the logic value 1, then the connection signal SWI takes on a higher voltage value in the case of a logic value 1 of the data input signal DINA, in comparison to a value in the case of the presence of the logic value 0 in the data input signal DINA. In accordance with the value of the data input signal DINA, the connection signal SWI can thus alternatively take on the value of the supply voltage VDD or of the intermediate level SZ, that is, for example, the value of half the supply voltage VDD. Here, the resistance value R1A of the first voltage splitter resistor 43 is approximately equal to the resistance value R1B, which is formed from the second voltage splitter resistor 46 and from the output switch 47 in the switched-on state.

In addition, from the connection signal SWI, the data output signal DOUTA can be obtained. For this purpose, the value of the connection signal SWI is compared to the reference value provided by the reference voltage splitter 50. If the connection signal SWI has a value greater than the reference value of the reference voltage splitter 50, then the data output signal DOUTA takes on the logic value 1. On the other hand, if the connection signal SWI has a value that is lower than the reference value, then the data output signal DOUTA has the logic value 0. The reference value is between the intermediate level SZ and the supply voltage VDD. For the readout of data from the connection signal SWI, the output switch 47 is set in such a manner that it does not influence the voltage value at the output connection 40. Thus, by means of the output circuit arrangement 12, information can be provided by means of the data input signal DINA to the output connection 40, and the clock connection signal CLKA can also be supplied to the output connection 40, and data in the form of the data output signal DOUTA can be received at the output connection 40.

The system 10 implements an interface for a data exchange between the circuit block 32 and the interface control block 54 that represents an external circuit. The system emulates an I2C interface. Alternatively, the system can also emulate a serial peripheral interface, abbreviated SPI interface. The two or three lines for such an interface are here combined to one line at the connection 13. The system 10 for this purpose uses the connection signal SWI with three signal levels and it also codes the operating mode via the speed of the change of the connection signal SWI, more precisely the falling edge of the connection signal SWI. The connection 13 is used multifunctionally. The system 10 thus makes do with a small number of connections and connection surfaces.

In an alternative embodiment, which is not shown, the output connection 40 is detachably connected to the connection 13. The connection is not permanent. The output connection 40 can be connected to the connection 13 via a plug-in contact.

In an alternative embodiment, which is not shown, the output circuit arrangement 12 is replaced by a signal generator, which forms the connection signal SWI with different levels. The signal generator can also be referred to as a production tester. Using such a production tester, the input circuit arrangement 11 can be characterized effectively.

In an alternative embodiment, which is not shown, the resistive element 29 comprises a diode and/or a transistor, which is connected as a resistor.

In an alternative embodiment, which is not shown, the switch 30 is connected to the connection 13, and the resistive element 29 is connected to the reference potential connection 28.

In an alternative embodiment, which is not shown, the resistive element 29 is integrated in the switch 30. The switch 30 is actuated in such a manner that it is put either into an open operating state or into an operating state in which the controlled section of the switch 30 has the predetermined resistance value in accordance with the ranges indicated above.

In an alternative embodiment, which is not shown, the second voltage splitter resistor 46 is connected to the reference potential connection 28, and the output switch 47 is connected to the output connection 41.

In an alternative embodiment, the detection circuit 14 comprises an off switch 35, which is connected between the output of the first comparing system 17 and the clock output 19. The detection logic 22 controls the off switch 35. In the case of the first operating mode A, the off switch 35 is switched to allow passage. In the case of the second operating mode B, the off switch 35 connects the clock output 19 to a connection with a constant voltage, for example, to the reference potential connection 28 or to the supply voltage connection 34. Thus, in the second operating mode B, advantageously at the data connection 20 as well as at the clock output 19, exclusively constant voltages are, or the reference potential VSS is, tappable, and, at these two connections 19, 20, no time-dependent signals are tappable. The clock and data interface is thus blocked in the second operating mode B.

In an alternative embodiment, which is not shown, a filter, which is used to filter the connection signal SWI, is connected after the connection 13.

FIG. 1B shows an additional embodiment as an example of the system according to the proposed principle, which is a variant of the system shown in FIG. 1A. The connection 13 is connected, in addition to the output connection 40, to an analog connection 60. The detection circuit 14 has an additional data connection 63. The additional data connection 63 is connected to the circuit block 32. The circuit block 32 is designed as a memory.

The first and the second comparing systems 17, 18 are implemented as a first or a second inverter 61, 62. The reverse switching threshold of an inverter depends on the threshold voltage of the p-channel transistor, on the threshold voltage of the n-channel transistor, on the width-to-length ratio of the p-channel transistor, as well as on the width-to-length ratio of the n-channel transistor. The first and the second inverters 61, 62 are implemented in such a manner that the first switching threshold SREF1 of the first inverter 61 is lower than the second switching threshold SREF2 of the second inverter 62.

The signal converter 27 comprises a third inverter 64, which is connected on the output side to the control connection of the switch 30. The switch 30 is implemented as a field-effect transistor. It is preferable to implement the switch 30 as an n-channel metal-oxide-semiconductor field-effect transistor. The data output 31 is connected to an input of the third inverter 64.

The input circuit arrangement 11 comprises a measurement object 65. The measurement object 65 is thus coupled to the connection 13. The measurement object 65 is connected via the resistive element 29 to the connection 13. Moreover, the measurement object 65 is coupled via an activation switch 66 to the reference potential connection 28. The activation switch 66 is implemented as an n-channel metal-oxide-semiconductor field-effect transistor. The circuit block 32 comprises the measurement object 65 and the activation switch 66. The input circuit arrangement 11 comprises an activation connection 67, which is connected to a control connection of the activation switch 66. The activation switch 66 is implemented like the switch 30. The activation switch 66 and the switch 30 have the same switch-on resistor.

The output switch 47 is implemented as a field-effect transistor. It is preferable that the output switch 47 is implemented as an n-channel metal-oxide-semiconductor field-effect transistor. The output circuit arrangement 12 comprises an output inverter 48, which couples the data output 45 to the control input of the output switch 47. The output inverter 48 can be omitted in an alternative embodiment, and it can be replaced by an inversion of the data input signal DINA in the interface control block 54.

The first and the second inverters 61, 62 form the first and the second comparative signals SK1, SK2. Due to the implementation of the two comparing systems 17, 18 as inverters 61, 62, the expense for the implementation of the comparing systems 17, 18 is kept very low. In addition, the first and the second inverters 61, 62 provide the first and the second comparative signals SK1, SK2 with only a very slight temporal delay in comparison to the connection signal SWI.

The signal buffer memory 23 comprises the buffer 36, which couples the connection 13 to the buffer output 24. The signal buffer memory 23 is designed unidirectionally. The additional circuit block 33 comprises the output active circuit 39, which is connected at a control input to the buffer output 24. The output active circuit 39 couples the supply voltage connection 34 to a switched supply connection 38. The output active circuit 39 comprises a transistor. The transistor is controlled with the input signal SE and it supplies a circuit portion—not shown—of the input circuit arrangement 11 with the supply voltage VDD.

At the data output 31, an output signal DOUT is applied. The third inverter 64 generates the inverted output signal DOUTN by inverting the output signal DOUT. The inverted output signal DOUTN is supplied to the switch 30.

An analog voltage VAN is applied at the analog connection 60. At the activation connection 67, an activation signal SAN is tappable, which is supplied to the activation switch 66. By means of the activation signal SAN and the activation switch 66, it is achieved that the measurement object 65 is connected in a current path between the connection 13 and the reference potential connection 28. The measurement object 65 can be, for example, a memory cell which can be programmed once, in English a one-time programmable cell, abbreviated OTP cell. The measurement object 65 is, for example, a fuse, in English fuse, that has a resistance value. By means of the activation switch 66, a current flow through the measurement object 65 is made possible, which leads to a voltage drop of the connection signal SWI. The measurement object 65 has a resistance value RMES. The resistance value RMES of the measurement object 65 can be calculated from the resistance value of the first resistive element 29, from the resistance value of the first voltage splitter resistor 43, from the voltage value of the analog voltage VAN, and from the voltage value of the supply voltage VDD. The analog resistance measurement of the resistance value RMES allows a quality assurance of the measurement object 65.

Thus, in addition, via the connection 13, available analog information can be provided to the input circuit arrangement 11. Thus, an analog measurement is carried out at a digital connection 13 or connection surface 15. An additional connection surface is not needed for the analog measurement. The memory in the circuit block 32 can thus be actuated efficiently. The reading in of data, the programming of the programmable cells, the readout of data, and the measurement of the resistance value of a cell can occur via the connection 13. The standardized activation of the interface makes it possible to develop a reusable test program for the memory.

In an alternative embodiment, which is not shown, the first comparing system 17 comprises an additional inverter, which is arranged between the first inverter 61 and the detection circuit 14. Accordingly, the second comparing system 18 comprises an additional inverter, which is arranged between the second inverter 62 and the detection circuit 14.

In an alternative embodiment, which is not shown, additional switches are arranged between the measurement object 65 and the connection 13. Furthermore, between the measurement object 65 and the reference potential connection 28, additional switches are arranged. Alternatively, the measurement object 65 is connected without intermediate circuit of the resistive element 29 to the connection 13.

In an alternative embodiment, which is not shown, the activation switch 66 couples the measurement object 65 to the supply voltage connection 34.

FIG. 2A shows embodiments as examples of signal curves of a system according to the proposed principle as a function of the time t. In FIG. 2A, the clock connection signal CLKA, the data input signal DINA, the data output signal DOUTA, the connection signal SWI, the clock signal CLK, the data signal DIN, and the inverted output signal DOUTN are represented. In a first time period between a first time t1 and a second time t2, the clock connection signal CLKA and the data input signal DINA are each at the logic value 1 and they have the value of the supply voltage VDD. The connection signal SWI has the voltage value of the clock connection signal CLKA. At the time t1', which follows the first time t1, the data input signal DINA is set to the logic value 0, and thus it takes on the voltage value 0 V. By means of the data input signal DINA, the output switch 47 is consequently switched to be conductive, so that the connection signal SWI takes on the intermediate level SZ, which is a value between the supply voltage and 0 V. If the resistance value of the first voltage splitter resistor 43 and the resistance value of the series circuit from the output switch 47 and from the second voltage splitter resistor 46 are equal, then, at the time t1', the connection signal SWI drops to the value of half of the supply voltage VDD.

At a time t1", which follows the time t1', the clock connection signal CLKA changes from the logic value 1 to the logic value 0, so that the connection signal SWI drops to a reference value, that is, to the voltage value of the reference potential VSS, which is 0 V. Thus, the drop of the connection SWI, from the value of the supply voltage VDD to 0 V, is carried out over one step. The decrease of the connection signal SWK thus occurs with a low steepness. Thus, the input circuit arrangement 11 detects the first operating mode A. The steepness of the change of the connection signal SWI can be defined, for example, as the ratio of a voltage difference ΔU of the connection signal SWI to the duration Δt that the connection signal SWI needs for the change by this voltage difference ΔU. The steepness can be determined, for example, at the time of the transition of the connection signal SWI from the supply voltage VDD to the reference potential VSS; the voltage difference ΔU can here be the value of the supply voltage VDD minus the value of the reference potential VSS. Alternatively, the steepness can be determined, for example, between 90% (VDD−VSS) and 10% (VDD−VSS).

The steepness is determined by the voltage difference between the second threshold value SREF2 and the first threshold value SREF1, the pulse duration of the pulse signal ST provided by the clock 21, which can also be referred to as the clock pulse generator, as well as by the number of the pulses between the edges of the first and the second comparative signals SK1, SK2. The pulse duration can be 10 µs, for example. If the number of pulses counted by the detection logic 22 is greater than a predetermined value, then the first operating mode A is detected. If the number of pulses counted is less than or equal to the predetermined value, then the second operating mode B is detected.

In a second time period between the second time t2 and a third time t3, the clock connection signal CLKA has a pulse. The data input signal DINA has the logic value 0. The connection signal SWI in the second time period has a pulse at the level of VDD/2 and it thus leads to a pulse in the clock signal CLK and to the logic value 0, which can also referred to as L or Low, in the data signal DIN.

In a third time period between the third time t3 and a fourth time t4, the clock connection signal CLKA has a pulse, and the data input signal DINA takes on the logic value 1, which can also be referred to as H or High. Consequently, the connection signal SWI has a pulse at the level of the supply voltage VDD. This leads to a pulse in the clock signal CLK and to a logic value 1 of the data signal DIN.

In a fourth time period between the fourth time t4 and a fifth time t5, the analog measurement of the resistance value RMES of the measurement object 65 is demonstrated. The clock connection signal CLKA has a pulse. Moreover, the data input signal DINA is set to the logic value 1. By means of the activation signal SAN shown in FIG. 1B, the measurement object 65 is connected between the connection 13 and the reference potential connection 28, so that, even in the case of a logic value 1 of the data input signal DINA, it is not the value of the supply voltage VDD that is reached at the analog connection 60, but a voltage value between the value of the supply voltage VDD and half of the supply voltage. From the analog voltage VAN reached at the analog connection 60, which corresponds to the voltage value of the connection signal SWI, the resistance value RMES of the measurement object 65 can be calculated. The pulse in the data signal DIN is suppressed.

The data output signal DOUTA takes on either the logic value 1 or the logic value 0, depending on whether the analog level of the connection signal SWI exceeds or does not exceed the reference level of the comparator 49.

In a fifth time period between the fifth time t5 and a sixth time t6, the clock signal CLKA has a pulse, and DINA has the logic value 1. Since the inverted output signal DOUTN generates a positive pulse, only a pulse at the level of half of the supply voltage VDD is measured at the connection signal SWI, and the output of the comparator 49 thus generates the logic value 0 of the data output signal DOUTA.

In a sixth time period between the sixth time t6 and a seventh time t7, the clock connection signal CLKA shows a pulse, and, moreover, the inverted output signal DOUTN has the logic value 0, and the data input signal DINA has the logic value 1. The provided connection signal SWI shows a pulse at the level of the supply voltage VDD. This is converted by means of the comparator 49 into a data output signal DOUTA with the logic value 1. For the digital reading, the second voltage splitter resistor 46 is thus switched off via the output switch 47, and the resistive element 29, which has approximately the same resistance value as the second voltage splitter resistor 46, is also connected or not also connected, via the switch 30, depending on the output signal DOUT, while the level of the clock connection signal CLKA reaches VDD. As a result, the level at the connection 13 is pulled to VDD/2, or it remains at VDD. The comparator 49 converts the level at the connection 13 into a digital HIGH or LOW and it generates the data output signal DOUTA.

In a seventh time period between the seventh time t7 and an eighth time t8, a slow rise of the connection signal SWI occurs. The slow rise of the connection signal SWI is achieved by the transition of the clock connection signal CLKA from the logic value 0 to the logic value 1 at a time t7' and by the subsequent transition of the data input signal DINA from the logic value 0 to the logic value 1 at a time t7". Thus, a stop condition is detected by the input circuit arrangement 11, so that the first operating mode A can be switched off. The input circuit arrangement 11 thus changes, when the stop conditions are detected, from the first operating mode A into the second operating mode B. FIG. 2A shows I2C-compatible signal shapes.

FIG. 2B shows additional signal shapes as examples of the system 10 according to the proposed principle. In FIG. 2B, the connection signal SWI, the input signal SE, and the additional data signal SEN are shown as a function of the time t. In FIG. 2B, a transfer sequence of the interface is shown. The transfer sequence can be implemented as an activation sequence. In a tenth time period between a tenth time t10 and an eleventh time t11, the connection signal SWI has a positive pulse, which leads to a pulse of the input signal SE. Since a temporal change is very rapid in the case of the falling edge of the connection signal SWI, the input circuit arrangement 11 is in the second operating mode B. In the tenth time period, an additional positive edge of the connection signal SWI occurs. In an eleventh time period between the eleventh time t11 and a twelfth time t12, the negative edge of the connection signal SWI occurs with one step. The falling edge in the connection signal SWI thus has a low speed.

As a result, the detection circuit 14 detects the first operating mode A. The detection circuit 14 and the signal buffer memory 23 are designed in such a manner that, even in the case of the detection of the first operating mode A, the input signal SE continues to have the logic value 1. The input signal SE is stored in the signal buffer memory 23, and it is retained for the duration of the first operating mode A.

In FIG. 2B, signal curves of the system shown in 1B are represented as examples. In a twelfth time period between the twelfth time t12 and a thirteenth time t13, the input circuit arrangement 11 is in the first operating mode A. After the performance of the start condition in the twelfth time period, the transfer sequence is initialized. In the detection circuit 14, the clock 21 is started. The detection logic 22 counts the pulses of the pulse signal ST, so that, during the entire predetermined maximum duration TOUT, the normal function of the connection 13 is turned off, and the input circuit arrangement is in the first operating mode A. In this time period, the transfer sequence is written. The second operating mode B is understood as normal function. The transfer sequence follows the specifications for a transfer sequence of an I2C interface.

The transfer sequence is used for the transfer of at least one byte. In FIG. 2B, three bytes in the transfer sequence are transferred. The transfer sequence is divided into several individual sequences C. The transfer sequence thus has, as structure, that first an 8 bit slave address with a detection pulse, acknowledge pulse in English, is transferred, and subsequently an 8 bit register address with detection pulse is transferred, and again subsequently 8 bit data with detection pulse are transferred by means of the connection signal SWI of the input circuit arrangement 11. A first single sequence C is thus used for the transfer of a component element address, in English a device address or slave address. In a second individual sequence C, a register address is transferred. In a third single sequence C, register data are transferred. The register data can be used, for example, for programming one-time programmable memory cells.

In this example, the code of the transfer sequence thus consists of 27 bits. The code of 27 bits has to be written in the maximum duration TOUT predetermined by the clock 21. The specification of the code length and the specification of the maximum duration TOUT offers a suitable protection above all against the random shifting of the input circuit arrangement 11 into the first operating mode A. If the connection signal SWI contains an erroneous code, that is, a code that differs from predetermined values of the code, or if the code becomes excessively slow, that is, it is not written within the predetermined maximum duration TOUT, then the transfer sequence is interrupted, and the input circuit arrangement 11 changes from the first operating mode A into the second operating mode B.

The input signal SE is constant during the first operating mode A, and it does not follow the connection signal SWI. The second operating mode B is not active during the activation. In the second operating mode B, the input signal SE would otherwise follow the connection signal SWI, which, in the case of the design of the input signal SE as an enable signal could lead to a lasting switching on and switching off the input circuit arrangement 11. The maximum duration TOUT is specified in such a manner that its value is sufficiently high so that the code with the transfer sequence can be sent within the maximum duration TOUT. Moreover, the maximum duration TOUT is selected to be sufficiently short so that, after an erroneously sent start condition, the second operating mode B, which represents the normal function of the input circuit arrangement 11, is delayed only imperceptibly.

In an embodiment, instead of the maximum duration TOUT, a time-out can be defined, within which a pulse must occur. After each pulse, this time-out is restarted. This corresponds thus to a minimum frequency for the data transfer, and it also allows longer pulse sequences. If the time-out is exceeded, then there is a switch from the first operating mode A into the second operating mode B.

In an embodiment, the activation can be provided additionally with a lock bit, in order to be able to completely deactivate the interface; a shifting into the first operating mode A is thus no longer possible.

FIG. 3 shows an embodiment as an example of the system according to the proposed principle, which is a variant of the system shown in FIGS. 1A and 1B. A first semiconductor body 80 comprises the input circuit arrangement 11 with the connection surface 15, pad in English, and the connection 13. In addition, a second semiconductor body 81 comprises the output circuit arrangement 12 with the output connection 40 and with the additional connection surface 41, pad in English. A connection wire 82 connects the connection surface 15 to the additional connection surface 41. The first and the second semiconductor bodies 80, 81 are applied to a support 83.

In an alternative embodiment, which is not shown, the first and the second semiconductor bodies 80, 81 are applied using the flip-chip technique to the support 83. For this purpose, the support 83 comprises a conductive path. The first semiconductor body 80 is applied with the surface that comprises the connection surface 15 to the support 83. Accordingly, the second semiconductor body 81 is arranged with the surface that comprises the additional connection surface 40 on the support 83. The connection of the connection surface 15 to the additional connection surface 40 is implemented as a soldering ball or a soldering bump between the connection surface 15 and the conductive path on the support 83, and as a soldering ball or a soldering bump between the conductive path on the support 83 and the additional connection surface 40.

The system 10 implements a single-wire interface: an additional level, the intermediate level SZ, is defined at half of the supply voltage VDD/2, which can be used in addition to the digital level supply voltage VDD for the logic value 1 or H and reference potential VSS for the logical value 0 or L. Internally, these levels are determined by the first and the second comparing systems 17, 18, whose switching thresholds SREF1 or SREF2 are respectively located between VDD and VDD/2 and between VDD/2 and VSS. Moreover, the system 10 is compatible with the I2C protocol: as a result of appropriate internal separation of the multilevel signals of the connection signal SWI at the connection 13, the I2C signals SCL and SDA, referred to above as clock signal CLK and data signal DIN, are emulated, and the interface is docked to an internal I2C bus.

The system 10 comprises a standardized activation of the interface connection 13: The I2C start sequence VDD-VDD/2-VSS makes it possible to start the transfer sequence, thus an internal time-out with the maximum duration TOUT starts. During this time, the normal function of the connection 13 is turned off for a brief time. If the maximum duration TOUT is exceeded, or if the command sequence is incorrect, the normal function, that is, the second operating mode B, is again completely active. However, if a valid activation code is sent within the time-out with the maximum duration TOUT, then the connection 13 remains for the time being in the first operating mode A and thus active as interface. A direct measurement at the analog connection 60 directly on the connection surface 15 can be used for the calculation of the resistance RMES of the measurement object 65.

LIST OF REFERENCE NUMERALS

10 System
11 Input circuit arrangement
12 Output circuit arrangement
13 Connection
14 Detection circuit
15 Connection surface
16 Evaluation circuit
17 First comparing system
18 Second comparing system
19 Clock output
20 Data connection
21 Clock
22 Detection logic
23 Signal buffer memory
24 Buffer output
25 Operating mode output
26 Output connection
27 Signal converter
28 Reference potential connection
29 Resistive element 30 Switch
31 Data output
32 Circuit block
33 Additional circuit block
34 Supply voltage connection
35 Off switch
36 Buffer
37 Additional buffer
38 Switched supply connection
39 Output active circuit
40 Output connection
41 Additional connection surface
42 Clock connection
43 First voltage splitter resistor
44 Voltage splitter
45 Data input
46 Second voltage splitter resistor
47 Output switch
48 Output inverter
49 Comparator
50 Reference voltage splitter
51 First comparative resistor
52 Second comparative resistor
53 Data output
54 Interface circuit block
55 Arrangement for generating an intermediate level
60 Analog connection
61 First inverter
62 Second inverter
63 Additional data connection
64 Third inverter
65 Measurement object
66 Activation switch
67 Activation connection
80 First semiconductor body
81 Second semiconductor body
82 Connection wire
83 Support
A First operating mode
B Second operating mode
C Single sequence
CLK Clock signal
CLKA Clock connection signal
DIN Data signal
DINA Data input signal
DOUT Output signal
DOUTA Data output signal
DOUTN Inverted output signal
SAN Activation signal
SB Operating mode signal
SE Input signal
SEN Additional data signal
SK1 First comparative signal
SK2 Second comparative signal
SO Circuit output signal
SOEN Output active circuit signal
SREF1 First threshold value
SREF2 Second threshold value
ST Pulse signal
SWI Connection signal
SZ Intermediate level
TOUT Maximum duration
t1 First time
t2 Second time
t3 Third time
t4 Fourth time
t5 Fifth time
t6 Sixth time
t7 Seventh time
t8 Eighth time
t10 Tenth time
t11 Eleventh time
t12 Twelfth time
t13 Thirteenth time
VAN Analog voltage
VDD Supply voltage
VSS Reference potential

We claim:

1. An input circuit arrangement, which is designed for operation either in a first or a second operating mode, the input circuit arrangement comprising:
a connection for supplying a connection signal;
a detection circuit that is coupled on the input side to the connection and is designed to put the input circuit arrangement into an operating mode from a group comprising the first and second operating modes depending on a steepness of a change of the connection signal,
wherein, in the first operating mode, via the connection, both data information and also clock information are supplied to the input circuit arrangement, and, in the second operating mode, the input circuit arrangement is designed to provide an input signal that corresponds to the connection signal; and
a signal converter connected to the connection, the signal converter having a switch and being designed to modulate the connection signal depending on the logic value of an output signal,
the detection circuit comprising:
a clock for the delivery of a pulse signal; and
a detection logic, which is coupled to the connection and to the clock and is designed, in the case of the detection of the first operating mode, to count the first pulses of the pulse signal and to maintain the first operating mode within a predetermined maximum duration,
wherein the detection logic is designed to switch over, within the predetermined maximum duration, from the first operating mode into the second operating mode if the connection signal comprises a signal sequence that deviates from a quantity of predetermined signal sequences.

2. The input circuit arrangement according to claim 1, wherein the detection circuit is designed to put the input circuit arrangement into the first operating mode if the steepness of the change of the connection signal is smaller than a predetermined value, and to put the input circuit arrangement into the second operating mode if the steepness of the change of the connection signal is greater than the predetermined value.

3. The input circuit arrangement according to claim 1 or 2, wherein the detection circuit is designed to put, depending on the steepness of the falling edge of the connection signal, the input circuit arrangement into an operating mode from the group comprising the first and the second operating modes.

4. An input circuit arrangement, which is designed for operation either in a first or a second operating mode, the input circuit arrangement comprising:
a connection for supplying a connection signal;
a detection circuit that is coupled on the input side to the connection and is designed to but the input circuit arrangement into an operating mode from a group comprising the first and second operating modes depending on a steepness of a change of the connection signal, wherein, in the first operating mode, via the connection, both data information and also clock information are supplied to the input circuit arrangement, and, in the second operating mode, the input circuit arrangement is designed to provide an input signal that corresponds to the connection signal;

a signal converter connected to the connection, the signal converter having a switch and being designed to modulate the connection signal depending on the logic value of an output signal; and a first and a second comparing system, which are each connected on the input side to the connection and on the output side to the detection circuit, and designed to compare the connection signal or a signal derived from the connection signal to a first or a second predetermined threshold value, and to provide, depending on the result of the comparison, a first or a second comparative signal to the detection circuit, wherein the detection circuit is designed to deliver, in the first operating mode, depending on the first comparative signal, a clock signal, and, depending on the second comparative signal, a data signal.

5. An input circuit arrangement, which is designed for operation either in a first or a second operating mode, the input circuit arrangement comprising:

a connection for supplying a connection signal;

a detection circuit that is coupled on the input side to the connection and is designed to but the input circuit arrangement into an operating mode from a group comprising the first and second operating modes depending on a steepness of a change of the connection signal, wherein, in the first operating mode, via the connection, both data information and also clock information are supplied to the input circuit arrangement, and, in the second operating mode, the input circuit arrangement is designed to provide an input signal that corresponds to the connection signal; and a signal converter connected to the connection, the signal converter having a switch and being designed to modulate the connection signal depending on the logic value of an output signal, wherein the detection circuit comprises an operating mode output for providing an operating mode signal that comprises a first value in the first operating mode and a second value in the second operating mode, and the input circuit arrangement comprises a signal buffer memory that is coupled at a first input to the connection and at a second input to the operating mode output, and which comprises a buffer output, and wherein the signal buffer memory is designed to store, in the second operating mode, a value of the connection signal or of a signal derived therefrom in the signal buffer memory, and subsequently to provide the value, at least in the first operating mode, at the buffer output.

6. The input circuit arrangement according to claim 1, wherein the signal converter is arranged between the connection and a supply voltage connection or a reference potential connection.

* * * * *